United States Patent [19]
Bond et al.

[11] 4,413,350
[45] Nov. 1, 1983

[54] PROGRAMMABLE CLOCK RATE GENERATOR

[75] Inventors: William C. Bond, Bethel; Gary A. Profet, Watertown, both of Conn.

[73] Assignee: General DataComm Industries, Inc., Danbury, Conn.

[21] Appl. No.: 224,336

[22] Filed: Jan. 12, 1981

[51] Int. Cl.³ .................. G06M 3/00; H03K 21/36
[52] U.S. Cl. ................................. 377/47; 364/703; 377/56; 377/114
[58] Field of Search .............. 377/37, 39, 44, 46, 377/47, 52, 56, 110, 114; 364/701, 703

[56] References Cited

U.S. PATENT DOCUMENTS

| | | | |
|---|---|---|---|
| 3,566,096 | 2/1971 | Schultheis, Jr. | 364/703 |
| 3,657,658 | 4/1972 | Kubo | 377/110 |
| 3,824,379 | 7/1974 | Tomisawa et al. | 377/46 |
| 3,909,791 | 9/1975 | van den Berg | 377/47 |
| 3,937,932 | 2/1976 | Ahlgren | 377/52 |
| 3,970,954 | 7/1976 | Even | 364/703 X |
| 4,084,082 | 4/1978 | Alfke | 377/47 |
| 4,140,970 | 2/1979 | Graziano | 377/47 |
| 4,184,068 | 1/1980 | Washburn | 377/47 |
| 4,251,722 | 2/1981 | Vautier | 377/47 |
| 4,254,327 | 3/1981 | Beno et al. | 377/44 |

Primary Examiner—Felix D. Gruber
Attorney, Agent, or Firm—Pennie & Edmonds

[57] ABSTRACT

A clock rate generator is described which can be programmed to provide an output clock rate that is N/M times the rate of a standard clock where N and M are integers. The generator comprises a counter, a programmable memory, reset logic and a clocking control. A standard clock is applied to the counter so that the counter is advanced by one for each clock bit. The output of the counter is connected to the input lines of the programmable memory where a pattern of binary ones and zeros are stored. The output of the programmable memory is applied to the clocking control to combine successive bits of the same polarity. The divisor M is determined by the number of standard clock counts between successive resets of the counter. The multiplier N is determined by the number of output cycles from the clocking control between successive resets of the counter.

15 Claims, 1 Drawing Figure

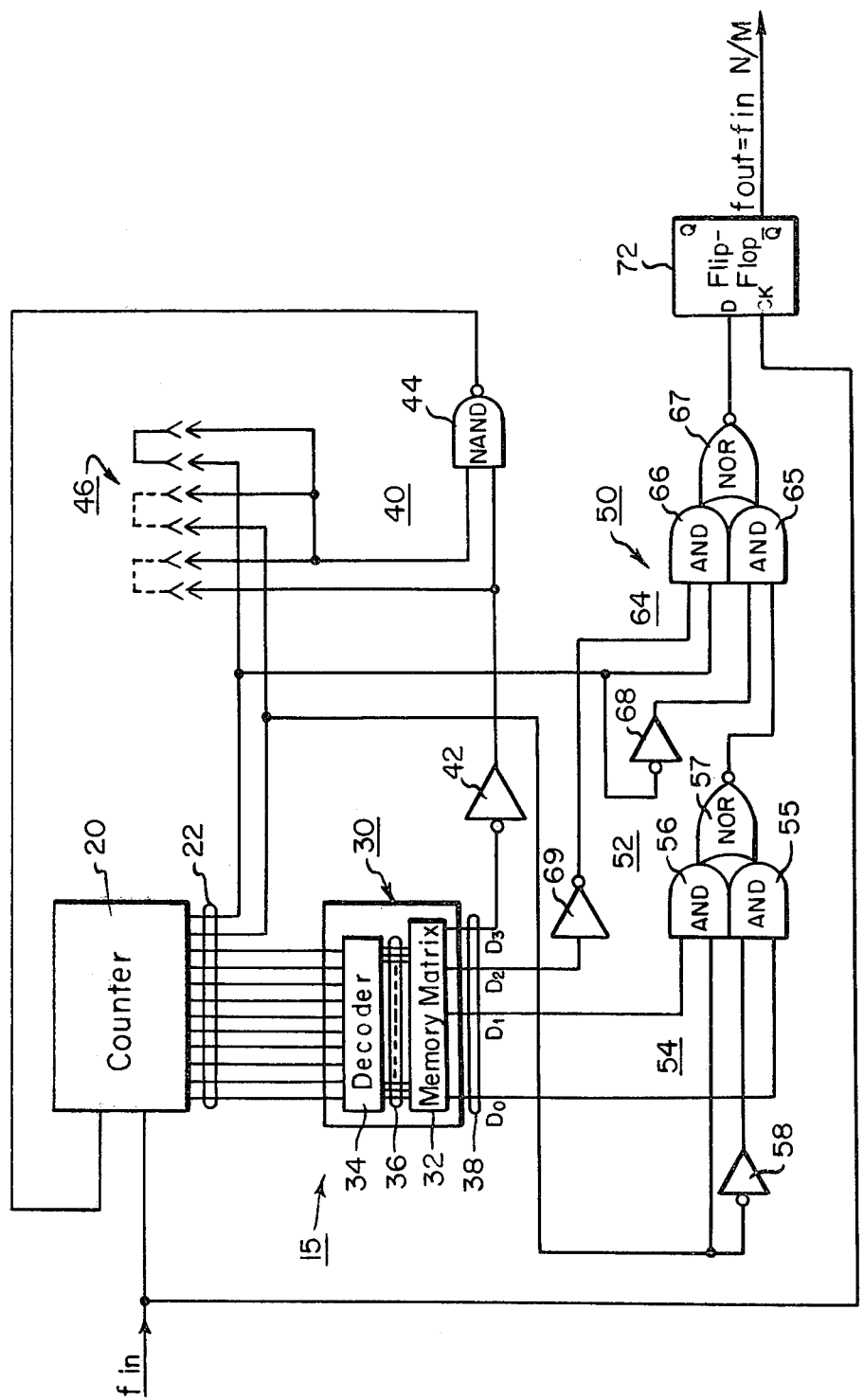

PROGRAMMABLE CLOCK RATE GENERATOR

TECHNICAL FIELD

This relates to a clock rate generator that may be programmed to provide an output clock having a rate that is N/M times the rate of a standard clock where N and M are integers.

BACKGROUND OF THE INVENTION

In many applications it is desirable to be able to modify the rate of a standard clock signal to provide frequencies different from that of the clock generator. The use of divider circuits in digital watches is just one of numerous examples where a high frequency clock signal is modified to produce a useful output. While straight forward division of clock signals is well known, it obviously is of limited value where the desired output signal is not an integral multiple or submultiple of the standard clock signal.

DISCLOSURE OF THE INVENTION

We have devised a programmable clock rate generator which may be programmed to provide an output clock that is N/M times the rate of a standard clock where N and M are integers. In a preferred embodiment of the invention, the programmable clock comprises a counter, a programmable memory, counter reset logic and a clocking control. The programmable memory comprises a memory matrix, an array of input lines, a decoder which decodes a parallel signal on the input lines to produce a signal on one of an array of address lines to the memory matrix and at least two output lines from the memory.

The standard clock signal is applied to the counter so that the counter is advanced by one for each clock bit. The output of the counter is connected to the input lines of the programmable memory. The output of the programmable memory is applied to the clocking control to eliminate access time glitches by combining successive bits of the same polarity. Suitable logic resets the counter every time the counter reaches a specified address location in the programmable memory.

The divisor M is determined by the number of standard clock counts between successive resets of the counter. The number M can be no larger than the product of the number of address locations in the programmable memory times one less than the number of output lines therefrom. The multiplier N is determined by the number of output cycles from the clocking control between successive resets of the counter where a cycle is the period commencing with the leading edge of a signal of one polarity and ending with the trailing edge of the immediately following signal of opposite polarity.

BRIEF DESCRIPTION OF THE DRAWING

These and other objects, features, elements and advantages of our invention will be readily apparent from the following detailed description of the invention in which the FIGURE is a block diagram of an illustrative embodiment of our invention.

BEST MODE FOR CARRYING OUT THE INVENTION

As shown in the FIGURE, a clock rate generator 15 of our invention comprises a counter 20, a programmable memory 30, a counter reset logic 40 and an output control 50. Generator 15 multiplies an input clock rate, $f_{in}$, by the fraction N/M where N and M are integers to produce an output clock rate $f_{out}=f_{in}\cdot N/M$.

The clock signal whose rate is to be modified by generator 15 is applied to the counting input of counter 20. Illustratively, counter 20 can count from zero to 4,095 and produces an output signal in parallel on an array 22 of output lines. Ten of these lines are connected as inputs to programmable memory 30. Programmable memory 30 comprises a memory matrix 32, a decoder 34 which decodes a signal on the input lines to produce a signal on one of an array 36 of address lines to the memory matrix and an array 38 of output lines from the memory. Illustratively, the capacity of memory matrix 32 is 1KX4 with binary values being stored in an array of 1,024 rows and 4 columns. For a matrix of this size, there are ten input lines, 1,024 memory address lines and four output lines $D_0$–$D_3$. The entire contents of this memory will be read out by counter 20 once in every 1,024 counts.

One of the output lines, $D_3$, from programmable memory 30 is applied to reset logic 40. As shown in the figure, the reset logic comprises an inverter 42 and a NAND gate 44, the output of inverter 42 being applied to one input of NAND gate 44 and the output of gate 44 being applied to the reset terminal of counter 20. Advantageously, the reset logic also comprises a range select jumper 46 which controls the signal applied to a second input to NAND gate 44.

The point at which counter 20 is reset and therefore the frequency of resetting is determined by the setting of range select jumper 46 and the location of a reset bit in memory 30. Range select jumper 46 operates as a switch to cause the reset bit to be effective when the counter is in the range 0–1,023, or the range 1,024–2,047, or the range 2,048–3,071. In particular, when the range select jumper is in the left-hand position in the FIGURE, NAND gate 44 is self-enabled by the reset bit. Since the entire contents of the memory are read out once in every 1,024 counts, the counter will be reset at some point in the range 0–1,023 when the jumper is in the left-hand position. When the range select jumper is in the center position, NAND gate 44 is enabled only when the signal on the eleventh output line from counter 20 is high; and at all other times the reset function is inhibited. Since this line is high when the counter is in the range 1,024–2,047, the counter will be reset at some point in this range. When the range select jumper is in the right hand position as depicted in the FIGURE, NAND gate 44 is enabled only when the signal on the twelfth output line from counter 20 is high. This causes the counter to be reset when it is in the range 2,048–3,071. Thus, the total usable counts from counter 20 can be as many as 3,072.

The remaining output lines $D_0$, $D_1$, $D_2$, from programmable memory 30 are applied to clocking control 50 which comprises a multiplexer (or paging device) 52 and a D-type flip-flop 72. Multiplexer 52 comprises two sets of gates 54, 64, the first of which comprises AND gates 55, 56, NOR gate 57, and inverter 58 and the second of which comprises AND gates 65, 66, NOR gate 67, and inverters 68, 69. D-type flip-flop 72 is a binary device which changes its output if, and only if, successive inputs to the flip-flop have different binary states. Flip-flop 72 is clocked by the input clock signal to combine successive bits from memory 30 which have the same polarity and thereby eliminate access time glitches.

As will be apparent from the FIGURE, the AND gates of gate 54 are controlled by the eleventh output line from counter 20 and the AND gates of gate 64 are controlled by the twelfth output line from counter 20. When counter 20 is in the range from 0-1,023, the signals on its eleventh and twelfth output lines are low, thereby disabling AND gates 56 and 66. At the same time, AND gates 55 and 65 are enabled because of the action of inverters 58 and 68. As a result, the signals on the first output line $D_O$ from memory 30 are passed through gates 54 and 64 to the input of flip-flop 72. When the counter is in the range 1,024-14 2,047, the output signal on the eleventh output line is high while that on the twelfth output line is low. As a result, AND gates 56 and 65 are enabled to pass the output signal on the second output line $D_1$ from memory 30 to the input of flip-flop 72. When the counter is in the range 2,048-3,071, the output signal on the eleventh line is low and the signal on the twelfth line is high. As a result, AND gate 66 is enabled while AND gate 65 disabled, thereby passing the signal onthe third output line $D_2$ from memory 30 to flip-flop 72.

As will be apparent to those skilled in the art, counter 20 and multiplexer 50 operate to convert memory 30 to a 3KK1 memory in which the contents of the memory that are read out on the first output line $D_0$ are addressed first, followed by the contents that are read out on the second output line and then the contents that are read out on the third output line $D_3$. Thus the memory, in effect, has 3,072 address locations corresponding to the 3,072 counts that are available from counter 20.

The contents of an illustrative portion of a memory matrix that may be used in the practice of the invention are set forth in table 1.

TABLE 1

| Memory Address | Output Line | | | |
|---|---|---|---|---|
| | $D_0$ | $D_1$ | $D_2$ | $D_3$ |
| 0 | 1 | 1 | 1 | 1 |
| 1 | 0 | 1 | 1 | 1 |
| 2 | 1 | 1 | 1 | 1 |
| 3 | 0 | 1 | 1 | 1 |
| 4 | 1 | 0 | 1 | 1 |
| 5 | 0 | 0 | 1 | 1 |
| 6 | 1 | 0 | 1 | 1 |
| 7 | 0 | 0 | 1 | 1 |
| 8 | 1 | 1 | 0 | 1 |
| 9 | 0 | 1 | 0 | 1 |
| 10 | 1 | 1 | 0 | 1 |
| 11 | 0 | 1 | 0 | 1 |
| . | . | . | . | . |
| . | . | . | . | . |
| . | . | . | . | . |
| 1018 | 1 | 1 | 0 | 1 |
| 1019 | 0 | 1 | 0 | 0 |
| 1020 | 1 | 0 | 0 | 1 |
| 1021 | 0 | 0 | 0 | 1 |
| 1022 | 1 | 0 | 0 | 1 |
| 1023 | 0 | 0 | 0 | 1 |

The reset bit is the zero bit stored at memory address 1019 in the fourth column (output line $D_3$). Depending on the position of range select jumper 46, this zero bit will cause counter 20 to reset after counter 1,020, or after count 2,044, or after count 3,068.

The pattern of ones and zeroes that is stored in successive addresses of the memory matrix in the first three columns causes the output of flip-flop 72 to cycle from high to low and back to high every time the output on one of lines $D_0$, $D_1$, $D_2$ goes from high to low and back to high. Thus, for the memory pattern depicted in Table 1, the output signal from flip-flop 72 will go through 512 cycles when counter 20 is counting from 0 to 1,023, it will go through 128 cycles when counter 20 is counting from 1,024 to 2,047 and it will go through 64 cycles when counter 20 is counting from 2,048 to 3,071. Since each clock signal applied to the input of counter 20 produces one count, this causes the output frequency, $f_{out}$, to equal $f_{in} \cdot (N/M)$, where N is the number of output cycles between successive resets of the counter and M is the number of counts between successive resets. For the output of flip-flop 72, a cycle may be defined as that period commencing with the leading edge of a signal of one polarity and ending with the trailing edge of the next following signal of opposite polarity. In terms of the signals on lines $D_0$, $D_1$, and $D_2$, a cycle may generally be defined as the period commencing with the leading edge of the first bit in a first string of consecutive bits of one polarity and ending with the trailing edge of the last bit in a second string of consecutive bits of the opposite polarity that immediately follows the first string, each string consisting of at least one bit.

For the example of Table 1, if the range select jumper 46 is in the left-hand position so that the reset bit at memory address 1019 causes the counter to reset after 1,020 counts, the output frequency is $f_{out} = f_{in} (510/1010)$. If the jumper is in the center position so that the counter resets after 2,044 counts, the output frequency is $f_{out} = f_{in} (639/2044)$. And if the jumper is in the right-hand position so that the counter resets after 3,068 counts, the output frequency is $f_{out} = f_{in} (704/3068)$.

Different patterns of ones and zeroes can be stored in memory matrix 32 so as to produce an output frequency that is a desired integral fraction of the input frequency. However, since a minimum of two bits are required to store each cycle, the maximum output frequency for the apparatus shown in the FIGURE will be one half that of the input frequency. If it is necessary to produce an output frequency that is more than one-half the input frequency, this can be achieved by using the apparatus of the FIGURE to produce an output frequency that is one-half that of the desired output frequency and then doubling the frequency produced so as to attain the desired output frequency. Numerous devices and techniques are available to perform such frequency doubling. Obviously multiple stages of frequency doubling can be used to produce an output frequency, $f_{out}$, that is equal to $f_{in} \cdot (n \, N/M)$ where n is a power of two and N and M are as defined above.

Since different patterns of ones and zeros can be stored in the memory matrix at the time its read only memory is programmed, the same device can be used to produce an enormous number of different ratios between output and input frequencies. The divisor M can be any integer less than or equal to the product of the number of address locations in the programmable memory times one less than the number of output lines therefrom. The multiplier N can be any integer up to M/2.

As will be apparent to those skilled in the art, the invention may be practiced in many forms. Illustratively, counter 20 is implemented with three 169-type 4-bit synchronous counters; and memory 30 is a 137-type 1KX4 bit programmable read only memory. The size of the counters and the memory, the number of output lines and the multiplexing techniques described above are only illustrative. Advantageously, memory 30 should be a programmable device so that the same apparatus 15 can be individually programmed to produce the different output frequencies required for specific applications. Where such flexibility is not required, a read only memory will suffice. Numerous other variations in the practice of the invention will be apparent.

What is claimed is:

1. A clock rate generator comprising:
   a counter to which is applied an input clock signal,
   a memory having an input to which is applied a portion of the output of said counter and an output on at least three output lines,
   counter reset logic connected to one output line from said memory for resetting the counter,
   means that are controlled by said counter and are connected to at least two other remaining output lines from said memory, for selecting for an output signal the signal on only one of said remaining output lines from said memory, and
   means that are connected to said selecting means so as to receive the output signal therefrom for combining successive output signals from said selecting means which have the same binary state, whereby the output signal from said combining means has a clocking rate which is an integral fraction of that of the input clock signal, the denominator of said fraction being determined by the number of counts between successive resets of said counter and the numerator being determined by the number of cycles in said output signal between successive resets of said counter.

2. The generator of claim 1 further comprising means controlled by the counter for limiting the frequency at which the counter is reset.

3. The generator of claim 1 wherein:
   the memory comprises a memory matrix having an array of rows and columns, a decoder which decodes the signal on said input to produce a signal on one of an array of address lines to the rows of the matrix, and an output line for each column of the matrix and
   a reset bit is stored in the column of the matrix whose output line is connected to the counter reset logic.

4. The generator of claim 3 further comprising logic means controlled by said counter for preventing the counter from being reset by said reset bit when the counter is in a specified range.

5. The generator of claim 4 wherein said logic means is programmable to vary the range in which the counter reset is inhibited.

6. The generator of claim 1 or claim 3 wherein said combining means is a binary state device which changes its output if, and only if, successive inputs to the device have different binary states.

7. The generator of claim 1 wherein a reset signal stored in said memory is produced on said one output line from said memory when the input applied to said memory from said counter reaches a specified count and the counter reset logic comprises:
   range select means connected at least to said counter for producing an output signal when the counter is counting within a range selected by said range select means, and
   logic means having first and second inputs and an output, said reset signal being applied to one of said inputs and the output signal from said range select means being applied to the other of said inputs, whereby a signal is applied from the output of said logic means to reset said counter only when the counter is counting within a specified range and the input applied to said memory reaches a specified count.

8. The generator of claim 1 wherein:
   a reset signal stored in said memory is produced on said one output line from said memory when the input applied to said memory from said counter reaches a specified count,
   The selecting means is controlled by said counter so that it selects for an output signal the signal on a first of said remaining output lines when said counter is counting in a first range and the signal on a second of said remaining output lines when said counter is counting in a second range, and
   The counter reset logic comprises:
   range select means connected at least to said counter for producing an output signal having a first characteristic when the counter is counting within said first range and a second characteristic when said counter is counting within said second range, and
   logic means having first and second inputs and an output, said reset signal being applied to one of said inputs and the output signal from said range select means being applied to the other of said inputs, whereby a signal is applied from the output of said logic means to said counter only when the counter is counting within a specified range and the input applied to said memory reaches a specified count.

9. A clock rate generator comprising:
   a counter to which is applied an input clock signal,
   a programmable memory having an input to which is applied a portion of the output of said counter and an output on at least three output lines,
   counter reset logic connected to one output line from said memory for resetting the counter,
   a reset bit stored at a location in said memory such that it is read out on said first output line when said location is addressed by said counter, and
   connected to the remaining output lines from said memory, means controlled by said counter for selecting as the output signal from said clock rate generator the signal on only one of said remaining output lines, whereby the output signal from said selecting means has a clocking rate which is an integral fraction of that of the input clock signal, the denominator of said fraction being determined by the number of counts between successive resets of said counter and the numerator being determined by the number of cycles in said output signal between successive resets of said counter.

10. The generator of claim 9 further comprising logic means controlled by said counter for preventing the counter from being reset by said reset bit when the counter is in a specified range.

11. The generator of claim 10 wherein said logic means is programmable to vary the range in which the counter reset is inhibited.

12. The generator of claim 9 wherein said selecting means produces an output signal that is applied to a binary state device which changes its output if, and only if, successive inputs to the device have different binary states.

13. The generator of claim 9 further comprising means for combining successive output signals from said memory which have the same binary state.

14. The generator of claim 9 wherein the counter reset logic comprises:
   range select means connected at least to said counter for producing an output signal when the counter is counting within a range selected by said range select means, and logic means having first and second inputs and an output, said first output line from said memory being applied to one of said inputs and the output signal from said range select means being applied to the other of said inputs, whereby a signal is applied from the output of said logic means to reset said counter only when the counter is counting within a specified range and the input applied to said memory reaches a specified count.

15. The generator of claim 9 wherein:

the selecting means is controlled by said counter so that it selects for an output signal the signal on a first of said remaining output lines when said counter is counting in a first range and the signal on a second of said remaining output lines when said counter is counting in a second range, and the counter reset logic comprises:

range select means connected at least to said counter for producing an output signal having a first characteristic when the counter is counting within said first range and a second characteristic when said counter is counting within said second range, and logic means having first and second inputs and an output, said first output line from said memory being applied to one of said inputs and the output signal from said range select means being applied to the other of said inputs, whereby a signal is applied from the output of said logic means to reset said counter only when the counter is counting within a specified range and the input applied to said memory reaches a specified count.

* * * * *